United States Patent [19]

Umehara

[11] Patent Number: 5,223,791

[45] Date of Patent: Jun. 29, 1993

[54] CROSS COIL TYPE INDICATING INSTRUMENT HAVING INTERNALLY DISPOSED ENGAGING GEARS

[75] Inventor: Hidemasa Umehara, Shimada, Japan

[73] Assignee: Yazaki Corporation, Tokyo, Japan

[21] Appl. No.: 815,195

[22] Filed: Dec. 31, 1991

[30] Foreign Application Priority Data

Jan. 14, 1991 [JP] Japan .............................. 3-004441[U]
Nov. 1, 1991 [JP] Japan .............................. 3-090197[U]

[51] Int. Cl.⁵ .......................... G01R 1/20; G01R 1/16
[52] U.S. Cl. ................................ 324/146; 324/151 A
[58] Field of Search ............... 324/125, 131, 132, 146, 324/147, 151 A, 151 R, 154 R, 154 PB

[56] References Cited

U.S. PATENT DOCUMENTS

| 3,114,878 | 12/1963 | Medlar | 324/146 |
| 3,323,058 | 5/1967 | Anthon | 324/132 |
| 5,062,135 | 10/1991 | Ohike | 324/146 |

FOREIGN PATENT DOCUMENTS 3144593  5/1983  Fed. Rep. of Germany .
267269  5/1990  Japan .
660894  11/1951  United Kingdom .

OTHER PUBLICATIONS

Patent Abstracts of Japan, vol. 013, nol. 064 (P-827) Feb. 14, 1989.
Elektrotechnik, vol. 55, Oct. 1973, p. 18, "Drehzahlwachter fur 1/100 bis 30000 min".

Primary Examiner—Walter E. Snow
Attorney, Agent, or Firm—Sughrue, Mion, Zinn, Macpeak & Seas

[57] ABSTRACT

A cross coil type indicating instrument including a coil bobbin having first and second chambers separately formed inside, a rotary shaft to which a magnet rotor and a rotary gear are secured in the first chamber, and an eccentric shaft to which a transmission gear is secured in the second chamber so as to engage with the rotary gear. A pointer is secured to an end portion of the eccentric shaft. Further, the coil bobbin has a coil winding portion with a flat surface outside where the first chamber is formed, and two coils are wound on the coil winding portion in such a manner that they are perpendicular to each other. Hence, the coils are guided linearly when wound on the coil winding portion.

7 Claims, 6 Drawing Sheets

CROSS COIL TYPE INDICATING INSTRUMENT HAVING INTERNALLY DISPOSED ENGAGING GEARS

BACKGROUND OF THE INVENTION

1. Field of the Invention

This invention relates to a cross coil type indicating instrument, and more particularly to a cross coil type indicating instrument suitable as a vehicle instrument such as a speed meter, revolution indicator or fuel gauge.

2. Description of the Related Art

An indicating instrument to be mounted on a vehicle is extensively employed which is designed as follows: The indicating instrument has a pair of coils which form magnetic fields perpendicular to each other. Current is allowed to flow in the pair of coils according to an amount of measurement, to cause the latter to form magnetic fields. As a result, the magnet rotor is rotated in the direction of the composite magnetic field due to the magnetic fields formed by the two coils, to turn the pointer thereby to indicate the amount of measurement.

FIGS. 9 and 10 show a movement of a conventional indicating instrument of this type. A movement 1 includes a coil bobbin 2 consisting of upper and lower bobbins 2a and 2b. Two coils 3a and 3b are wound on the coil bobbin 2 in such a manner that they are perpendicular to each other. A disk-shaped magnet rotor 4 with N and S poles is provided inside the coil bobbin 2 on which the coils 3a and 3b are wound as was described above. The magnet rotor 4 is fixedly secured to a rotary shaft 5, namely, a pointer shaft which is axially extended through the inside of a shaft supporting portion 2c of the coil bobbin 2. The magnet rotor accommodating portion of the coil bobbin 2 has a bearing recess 6 in its bottom at the center. The bearing recess 6 and the lower half of the magnet rotor accommodating portion are filled with silicon 7 high in viscosity.

The lower end portion of the rotary shaft 5 is rotatably supported on the bottom of the bearing recess 6. The lower half of the magnet rotor 4 is held in the silicon 7 to brake the rotary shaft 5. When no current is supplied to the coils 3a and 3b, the magnet rotor 4 is rotatable freely. On the other hand, when currents are supplied to the coils 3a and 3b, the magnet rotor 4 is turned by a predetermined angle.

A dial 8 is mounted over the movement 1, and a pointer 9 is fixedly secured to the end portion of the rotary shaft 5 which is protruded through the dial 8.

In FIG. 10, reference numeral 10 designates a movement casing which accommodates the coil bobbin 2 and shields the magnetic field.

The conventional indicating instrument thus constructed will be described in more detail with reference to FIGS. 11(a) through 13. When a voltage $V_0 \cos \theta$ is applied to the coil 3a and a voltage $V_0 \sin \theta$ is applied to the coil 3b as shown, currents according to the respective voltages flow in the coils 3a and 3b, so that the coils 3a and 3b form magnetic fields $\phi_1$ and $\phi_2$ respectively. Ideally, the magnetic fields thus formed are perpendicular to each other, and form a composite magnetic field $\phi$ in the direction which is obtained by combining the directions of the magnetic fields $\phi_1$ and $\phi_2$.

The magnitudes of the magnetic fields $\phi_1$ and $\phi_2$ are proportional to the voltages $V_0 \cos \theta$ and $V_0 \sin \theta$, respectively. Hence, the direction of the composite magnetic field $\phi$ is at the angle $\theta$. Therefore, by allowing the angle $\theta$ to correspond to a predetermined amount of measurement, the direction of the composite magnetic field $\phi$ corresponds to the amount of measurement. Thus, the magnet rotor 4, i.e. the rotary shaft 5 is turned according to the composite magnetic field, to turn the pointer 9 over the dial 8 to indicate the amount of measurement.

The rotary shaft 5 is turned while being braked by the silicon 7 in the coil bobbin 2. This prevents the rotary shaft 5 and accordingly the pointer 9 from being unnecessarily vibrated. When no currents flow in the coils 3a and 3b as in the case where the motor vehicle is not in operation, the rotary shaft 5 is released, and therefore means (not shown) for returning the pointer 9 to the zero point operates to return the pointer 9 to the predetermined zero position.

In the above-described conventional indicating instrument, as shown in FIG. 9, the shaft supporting portion 2c of the coil bobbin 2 is substantially cylindrical. Therefore, when the coils 3a and 3b are wound on the coil bobbin 2, the coils 3a and 3b are guided and curved by the outer surface of the shaft supporting portion 2c. Hence, the resultant coils 3a and 3b are poor in alignment. In this case, the coils form unwanted magnetic fields in addition to those which are perpendicular to each other. Because of the unwanted magnetic fields thus formed, the indication of the pointer 9 is lowered in linearity; that is, the pointer 9 cannot indicate a correct value.

SUMMARY OF THE INVENTION

In view of the foregoing, an object of this invention is to provide a cross coil type indicating instrument which indicates a measurement value with high accuracy with the non-linearity in indication of the pointer minimized which is due to the fact that the cross coils are not in alignment.

A cross coil type indicating instrument according to the invention comprises a coil bobbin having first and second chambers separately formed inside, and having a coil winding portion with a flat surface outside where the first chamber is formed; two coils wound on the coil winding portion of the coil bobbin in such a manner that the coils are perpendicular to each other; a rotary shaft rotatably arranged with both ends thereof supported by top and bottom portions of the first chamber in the coil bobbin; a magnet rotor, fixedly secured to the rotary shaft, which is rotated according to a composite magnetic field due to magnetic fields formed by the two coils; a rotary gear, fixedly secured to the rotary shaft, which is rotated with the magnet rotor; a transmission gear provided in the second chamber of the coil bobbin so as to engage with the rotary gear; an eccentric shaft, to which the transmission gear is fixedly secured, having an end portion protruded out of the coil bobbin; and a pointer fixedly secured to the end portion of the eccentric shaft.

In the indicating instrument, the torque of the magnet rotor is transmitted through the rotary gear and the transmission gear to the eccentric shaft, so that the pointer secured to the eccentric shaft is turned. Further, the coils are guided linearly when wound on the coil winding portion of the coil bobbin. This improves the alignment of the coils markedly; that is, it minimizes the non-linearity in indication of the pointer which attributes to the fact that the coils are not in alignment.

Thus, the indicating instrument of the invention indicates a measurement value with high accuracy.

DETAILED DESCRIPTION OF THE PREFERRED EMBODIMENTS

Preferred embodiments of the invention will be described with reference to FIGS. 1 through 8.

Figure 1:
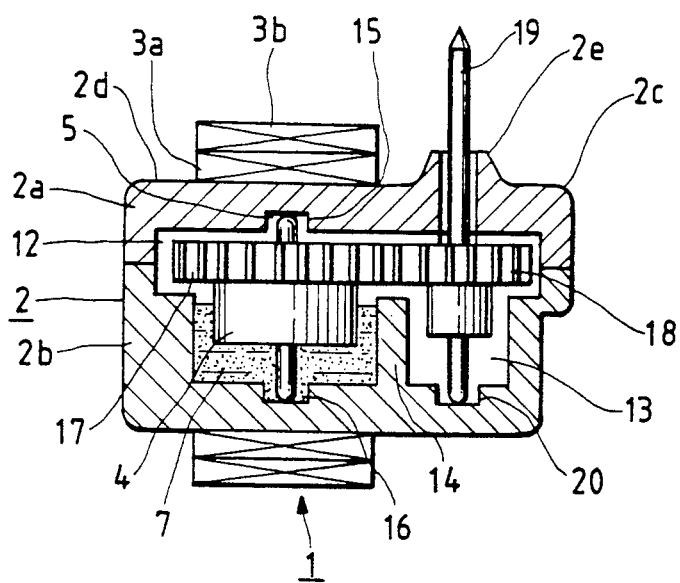
FIG. 1 is a vertical sectional view showing an example of a movement in a cross coil type indicating instrument according to this invention.
Figure 2:
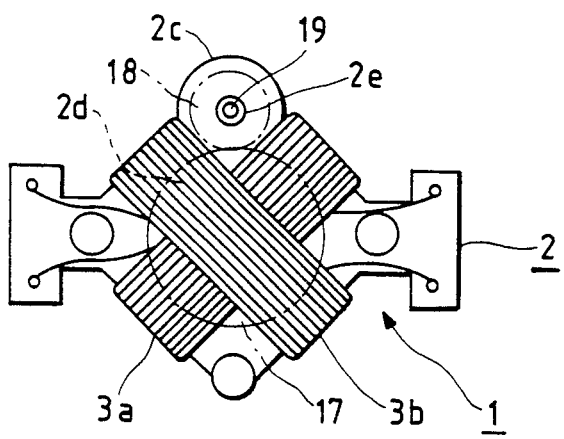
FIG. 2 is a plan view of the movement shown in FIG. 1.
Figure 3:
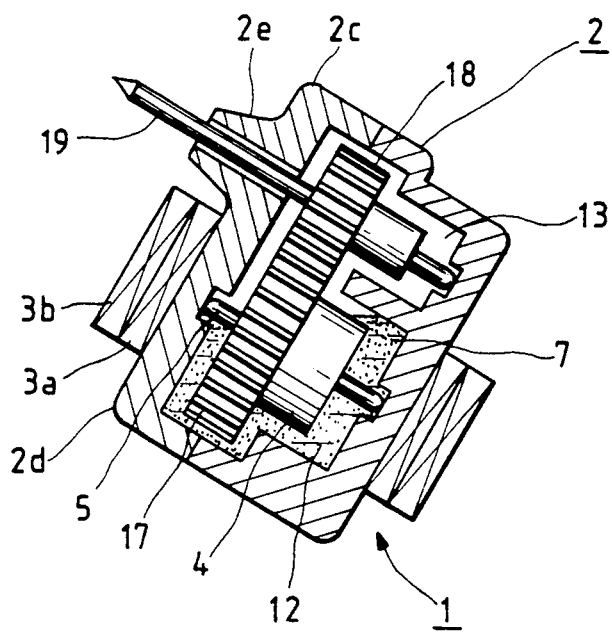
FIG. 3 is a vertical sectional view showing the movement which is installed on a vehicle.

FIGS. 1 through 3 show an example of a coil bobbin in a cross coil type indicating instrument according to the invention. A coil bobbin 2 consisting of upper and lower bobbins 2a and 2b is made up of a coil winding portion 2d and shaft supporting portion 2c. The coil winding portion 2d has a flat and rectangular surface. The shaft supporting portion 2c extends from one end of the coil winding portion 2d, and has a substantially cylindrical bearing portion 2e at the center. A magnet rotor chamber 12 for accommodating a disk-shaped magnet rotor 4 is formed inside the coil bobbin 2 at the coil winding portion 2d, and an eccentric shaft chamber 13 for accommodating an eccentric shaft 19 is formed inside the coil bobbin 2 at the shaft supporting portion 2c. A partition wall 14 is formed between the magnet rotor chamber 12 and the eccentric shaft chamber 13. More specifically, the partition wall 14 is extended upwardly from the bottom of the lower bobbin 2, forming an upper communication space above it through which the two chambers are communicated with each other.

The magnet rotor chamber 12 has bearing recesses 15 and 16 formed respectively in the top and the bottom at the center. A rotary shaft 5, to which the magnet rotor 4 is secured, is rotatably supported with its both ends engaged with the bearing recesses 15 and 16. A rotary gear 17 is provided on the upper surface of the magnet rotor 4. More specifically, the rotary gear 17 is secured to the rotary shaft 5 and is engaged with a transmission gear 18 through the aforementioned upper communication space between the magnet rotor chamber 12 and the eccentric shaft chamber 13. The space below the magnet rotor 4 is filled with silicon 7 high in viscosity. This is to brake the rotary shaft 5, thereby to prevent a pointer (which will be described later) from being unnecessarily vibrated.

In addition, if the eccentric shaft chamber 13 is also filled with the silicon 7, the eccentric shaft 19 can be braked by the silicon 7, to prevent the pointer from being unnecessarily vibrated.

In the eccentric shaft chamber 13, the aforementioned eccentric shaft 19, namely, a pointer shaft, to which the transmission gear 18 engaged with the rotary gear 17 is fixedly secured, is arranged in parallel with the rotary shaft 5. The eccentric shaft 19 protrudes above the eccentric shaft chamber 13, and is rotatably supported by the shaft supporting portion 2e adapted to support the shaft 19 in a horizontal direction and by a bearing recess 20 formed in the bottom of the eccentric shaft chamber 13. The pointer (not shown) is fixedly secured to the upper end portion of the eccentric shaft 19 which is protruded outside the coil bobbin 2 through the shaft supporting portion 2e.

Coils 3a and 3b are wound around coil winding portion 2d of the coil bobbin 2, which accommodates the magnet rotor 4 and the eccentric shaft 19. More specifically, the coils 3a and 3b are wound around the coil winding portion 2d while being guided linearly by the outer surface thereof, so that the resultant coils are perpendicular to each other. Thus, a cross coil type movement has been formed. Further, a dial (not shown) is set above the movement 1.

In the indicating instrument thus constructed, predetermined currents, which correspond to a drive signal according to a measurement signal, are applied to the coils 3a and 3b, to cause the coils to form magnetic fields, as a result of which the magnet rotor 4 is turned according to the composite magnetic field due to the magnetic fields formed by the coils 3a and 3b. The torque of the magnet rotor 4 is transmitted through the rotary gear 17 and the transmission gear 18 to the eccentric shaft 19, and the pointer secured to the eccentric shaft 19 is turned over the dial to indicate the amount of measurement. In this operation, the rotary shaft 5 of the magnet rotor 4 and the eccentric shaft 19 are turned while being braked by the silicon 7 in the magnet rotor chamber 12 so as to prevent the pointer from being unnecessarily vibrated.

In the above-described indicating instrument, the coil winding portion 2d of the coil bobbin 2 has the flat and rectangular surface, and the coils 3a and 3b are wound on the coil winding portion 2d in such a manner that they are perpendicular to each other. That is, in the indicating instrument, unlike the conventional one, the coil winding portion 2d has no shaft supporting portion adapted to support the pointer shaft, and instead the coil winding portion 2d is partially expanded at one corner to form the shaft supporting portion 2c. Because of this structure, the coils 3a and 3b can be guided linearly when wound on the coil winding portion 2d. Thus, the resultant coils 3a and 3b are excellent in alignment.

As a result, in the case where currents according to a measurement signal are supplied to the coils 3a and 3b to indicate the amount of measurement, the coils 3a and 3b form magnetic fields only perpendicular to each other. Thus, the indicating instrument of the invention, unlike the conventional one, is free from the difficulty that, because the cross coils are low in alignment, they form unwanted magnetic fields in addition to the magnetic fields perpendicular to each other. That is, with the indicating instrument of the invention, the difficulty is eliminated that the unwanted magnetic fields adversely affects the linearity in indication of the pointer. Thus, the indicating instrument of the invention can indicate a measurement value with high accuracy.

The above-described indicating instrument is mounted inside the instrument panel of a vehicle (not shown) in such a manner that, as shown in FIG. 3, the eccentric shaft chamber 13 comes above the magnet rotor chamber 12 and the eccentric shaft 19 is extended obliquely.

Hence, while the instrument is used for a long time, the silicon 7 in the magnet rotor chamber 12 may be shifted. However, in such a case, in the indicating instrument of the invention, the silicon 7 in the magnet rotor chamber 12 will not be shifted into the eccentric shaft chamber 13 although it is large in quantity, and it will never leak out of the coil bobbin 2 through the gap between the eccentric shaft 19 and the shaft supporting portion 2e supporting the shaft 19, because the eccentric shaft chamber 13 is positioned above the magnet rotor chamber 12 and the eccentric shaft 19 is extended obliquely as was described above. That is, the indicating instrument of the invention is free from the difficulty that the silicon leaked out stains the movement 1 in its entirety.

FIGS. 4 through 8 show another example of the movement in the indicating instrument according to the invention, which is improved more in the linearity in indication of the pointer.

In the movement shown in FIGS. 1 and 2, the coils 3a and 3b wound on the coil winding portion 2d of the coil bobbin 2 are multi-layer windings. Therefore, in the case where those coils 3a and 3b are equal in the number of turns, the magnetic field formed by the inner coil, namely, the coil 3a is greater than that formed by the outer coil, namely, the coil 3b.

Figure 4:
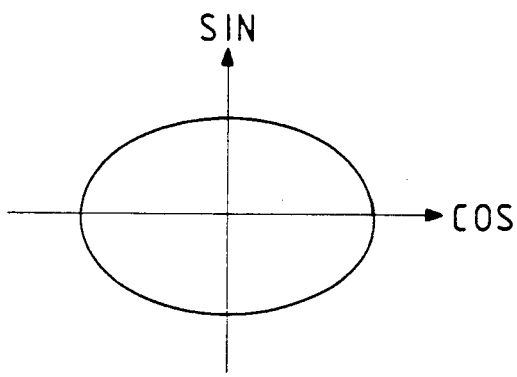
FIG. 4 is an explanatory diagram showing a characteristic of torque for the magnetic fields produced by coils in the movement.
Figure 5:
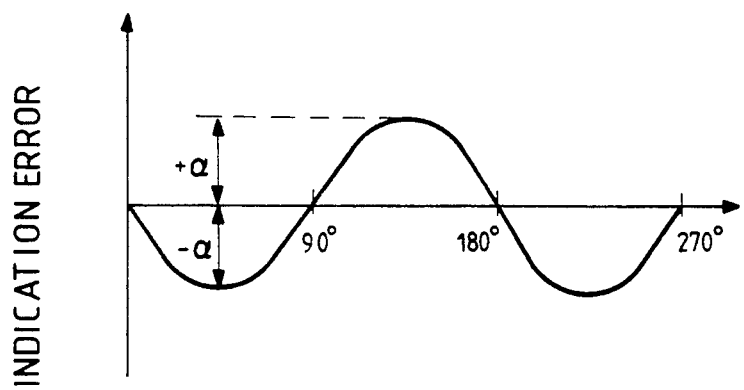
FIG. 5 is a graphical representation for a description of indication errors depending on the magnitudes of the magnetic fields formed by the coils.
Figure 6:
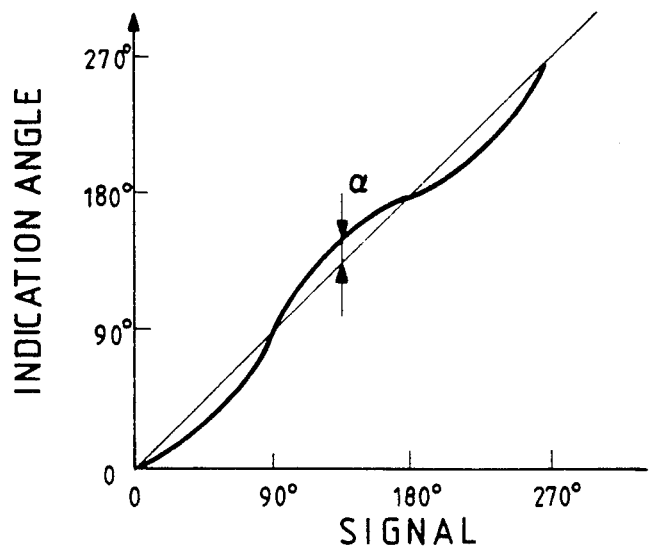
FIG. 6 is a graphical representation for a description of the characteristic for indication of the pointer in the indicating instrument.

Here, it is assumed that the coil 3a is a cosine coil to which a voltage $V_0 \cos \theta$ is applied, and the coil 3b, a sine coil to which a voltage $V_0 \sin \theta$ is applied. Then, the cosine coil 3a, or the inner coil, being closer to the magnet rotor 4, produces a magnetic field greater than the sine coil 3b, or the outer coil. Thus, the torque for the magnetic fields formed by the coils 3a and 3b is as shown in FIG. 4. Hence, the error in indication of the pointer, which is turned in the direction of the composite magnetic field due to the magnetic fields formed by the coils 3a and 3b, is as shown in FIG. 5. More specifically, in the first (or third) quadrant, the indication value tends to be smaller than the true value, and in the second (or fourth) quadrant, it tends to be larger than the true value. Because of this indication error, the pointer indication characteristic is as shown in FIG. 6; that is, the linearity in indication of the pointer is low, and the value indicated is not correct.

This difficulty may be eliminated by employing a method in which the numbers of turns of the coils 3a and 3b are changed so that the magnetic fields formed by them are equal to each other. However, the method is disadvantageous in that it is rather troublesome to control the number of turns during the coil winding operation. Hence, in this example of the movement, the numbers of turns of the coils 3a and 3b are maintained unchanged, and in the structure shown in FIGS. 1 and 2 the rotary gear 17 and the transmission gear 18 are modified into elliptic gears with which the distance between the rotary shaft 5 and the eccentric shaft 19 can be maintained constant.

In this example of the movement in the indicating instrument of the invention, the rotary gear 17 and the transmission gear 18 are engaged with each other in a plane with positional relationships as shown in FIG. 7. When, as shown in FIGS. 7(a) through 7(d), the rotary gear 17 is turned counterclockwise through angles $\theta_1$, $\theta_2$ and $\theta_3$ ($\theta_1 = \theta_2 = \theta_3$), that is, 90° in total, the transmission gear 18 is turned clockwise through angles $\theta'_1$, $\theta'_2$ and $\theta'_3$, that is, 90° in total. In this operation, the angles of rotation of the transmission gear 18 are in the following relation:

$$\theta'_1 < \theta'_2 < \theta'_3$$

Figure 7A:
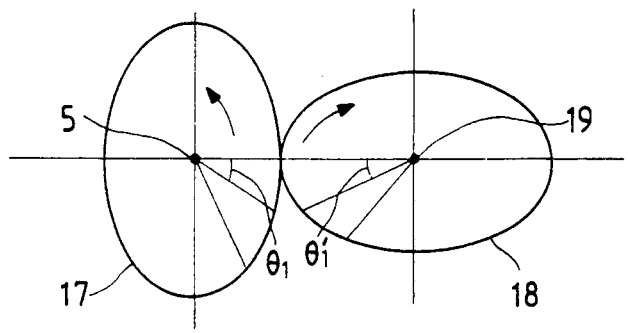
FIGS. 7(a) through 7(d) are explanatory diagrams for a description of the rotation angles of a transmission gear which is turned with a rotary gear in the movement.
Figure 7B:
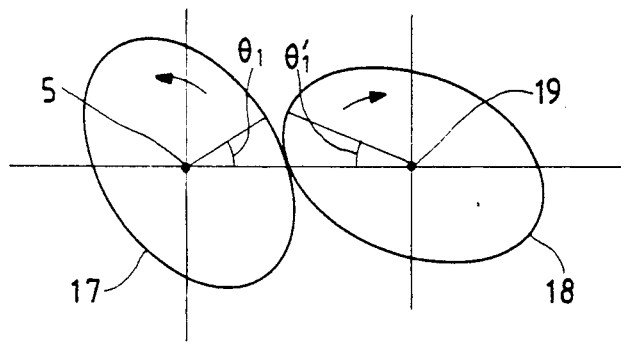
Figure 7C:
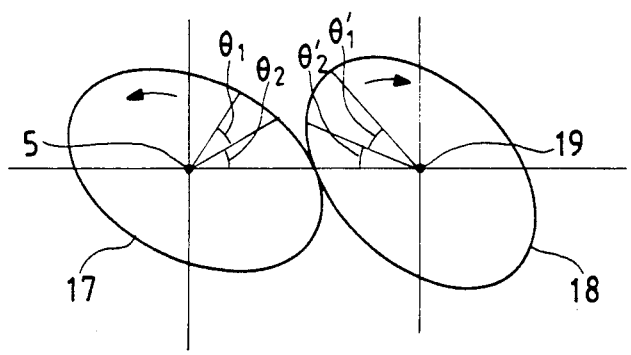
Figure 7D:
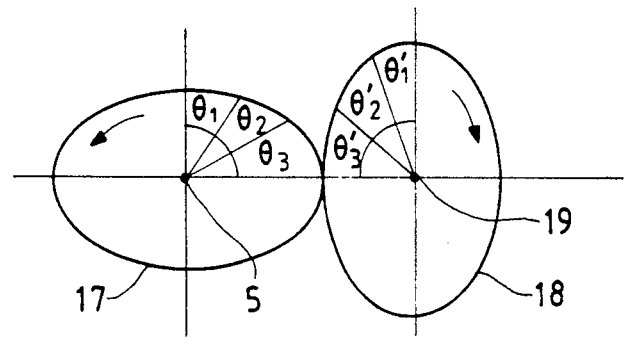
Figure 8:
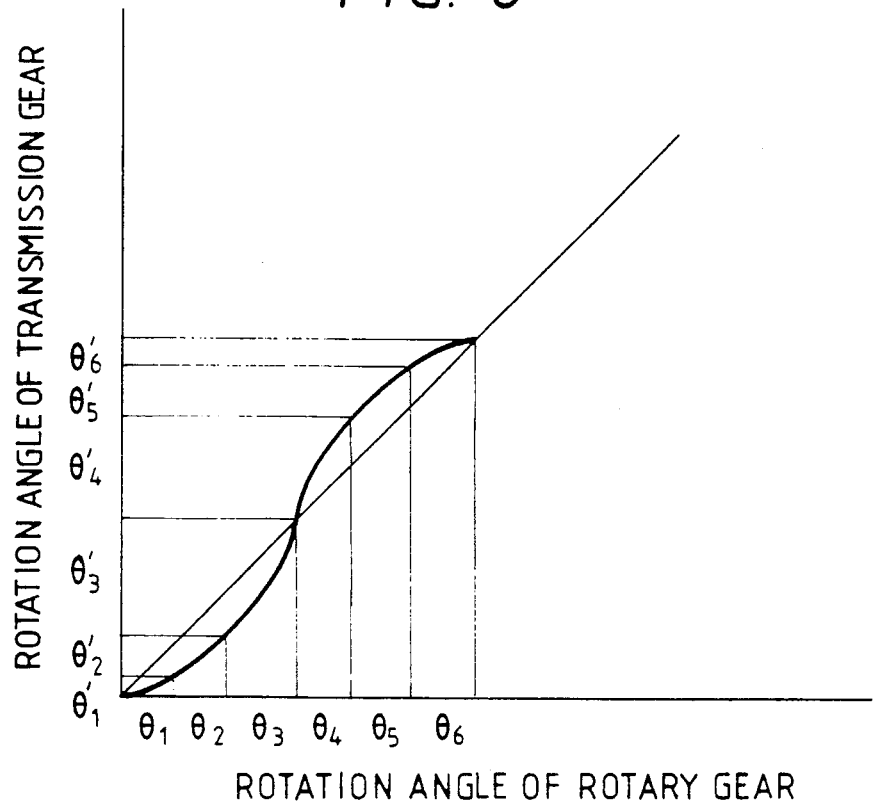
FIG. 8 is a graphical representation indicating the rotation angles of the rotary gear with the rotation angles of the transmission gear.
Figure 9:
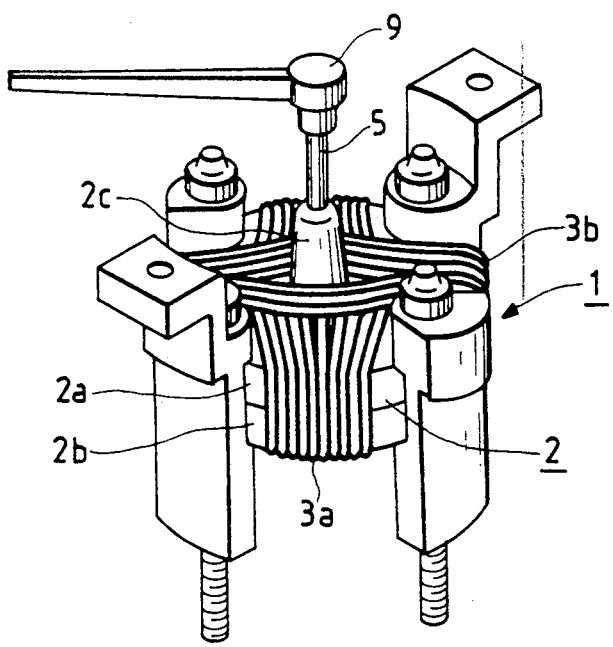
FIG. 9 is a perspective view showing a conventional movement in a cross coil type indicating instrument.
Figure 10:
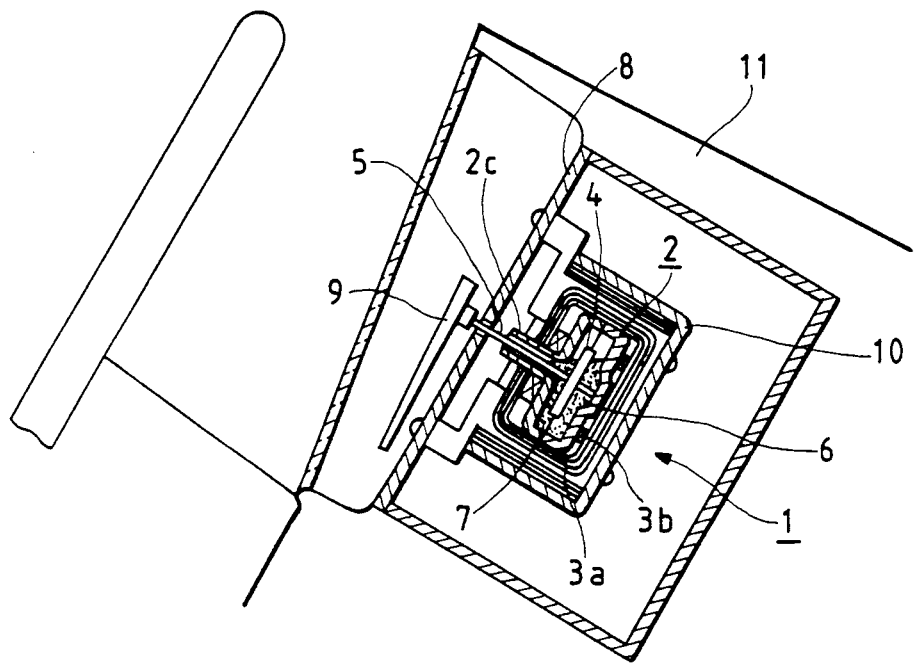
FIG. 10 is a vertical sectional view showing the conventional movement mounted on a vehicle.
Figure 11A:
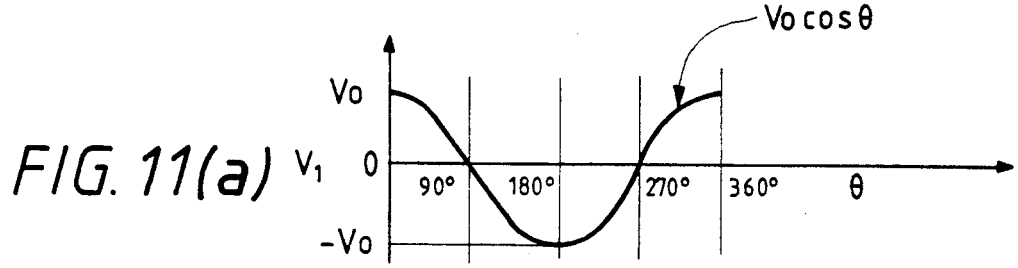
FIGS. 11(a) and 11(b) are graphical presentations indicating the waveforms of voltages applied to the coils in the movement.
Figure 11B:
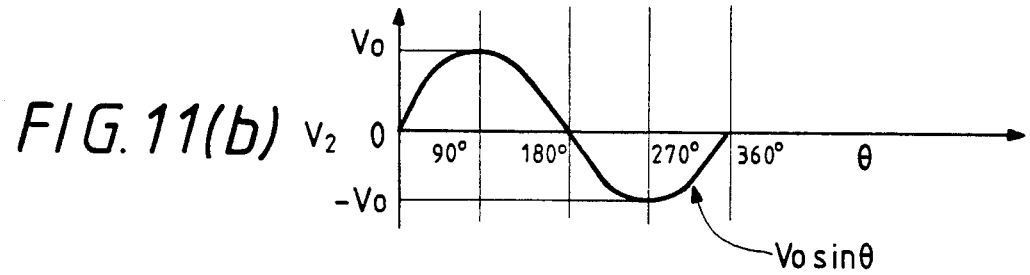
Figure 12:
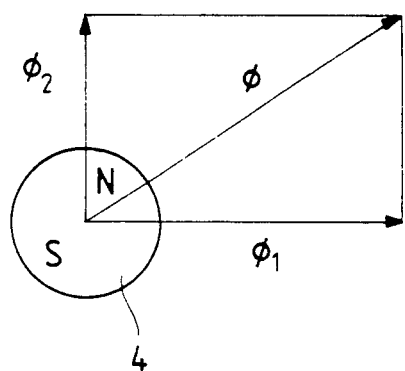
FIG. 12 is an explanatory diagram for a description of the direction of the composite magnetic field due to the magnetic fields by the coils.
Figure 13:
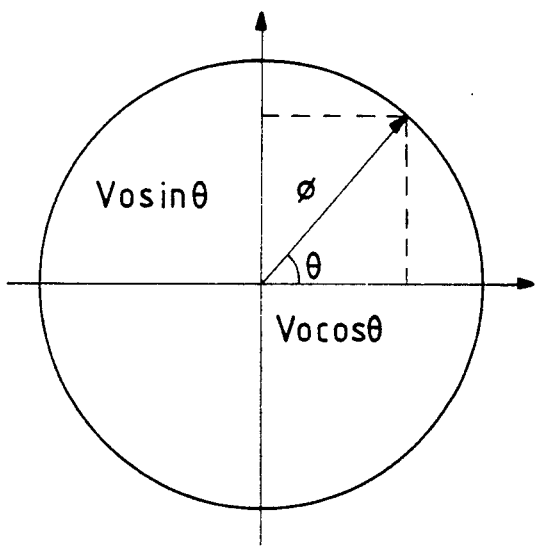
FIG. 13 is an explanatory diagram for a description of the characteristic of the composite magnetic field due to the magnetic fields formed by the coils.

Accordingly, under the condition as shown in FIG. 7, the relation between the rotation angles $\theta_1$, $\theta_2$ and $\theta_3$ of the rotation gear 17 and the rotation angles $\theta'_1$, $\theta'_2$ and $\theta'_3$ of the transmission gear 18 is as shown in FIG. 8. That is, the rotation angle of the transmission gear 18 per rotation angle of the rotary gear 17 is increased. This is equivalent to the fact that, in the case where the pointer is turned together with the transmission gear 18, a value indicated by the rotation of the transmission gear 18 is smaller than the true value provided by the rotation of the rotary gear 17.

Similarly, under the condition shown in FIG. 7(d), when the rotary gear 17 is further turned 90° counterclockwise, the transmission gear 18 is further turned 90° clockwise. In this operation, the rotation angle of the transmission gear 18 per rotation angle of the rotary gear 17 is decreased. This is equivalent to the fact that a value indicated by the rotation of the transmission gear 18 is larger than the true value provided by the rotation of the rotary gear 17 (the relation between the rotation angles $\theta_4$, $\theta_5$ and $\theta_6$ and those $\theta'_4$, $\theta'_5$ and $\theta'_6$ in FIG. 8).

Hence, in this example of the movement in the indicating instrument of the invention, the characteristic of the rotary gear 17 and the transmission gear 18 which are elliptic gears is utilized to overcome the difficulty that the linearity in indication of the pointer is lowered because of the difference in field strength between the magnetic fields formed by the inner coil 3a and the outer coil 3b. That is, the rotary gear 17 and the transmission gear 18 are so modified that, in the case where a value indicated by the pointer is smaller than the true value, the rotation angle of the transmission gear 18 per rotation angle of the rotary gear 17 is decreased, and in the case where a value indicated by the pointer is larger than the true value, the rotation angle of the transmission gear 18 per rotation angle of the rotary gear 17 is increased. Since this modification prevents the linearity in indication of the pointer from being lowered, the pointer indicates a measurement value with higher accuracy.

The angle of swing of the pointer can be adjusted voluntarily by changing the gear ratio of the rotary gear 17 and the transmission gear 18.

In the cross coil type indicating instrument of the invention, the coil bobbin has the coil winding portion with the flat surface where the magnet rotor is accommodated, and the coils are wound on the coil winding portion in such a manner that they are perpendicular to each other. Hence, the coils are guided linearly when wound on it. Therefore, the resultant coils are much improved in alignment. That is, in the indicating instrument of the invention, the non-linearity in indication of the pointer is minimized which is due to the fact that the coils are not in alignment, and the measurement value can be indicated with higher accuracy.

Furthermore, in the indicating instrument, the rotary gear and transmission gear are modified in such a manner that, in the case where a value indicated by the pointer tends to be smaller than the true value, the rotation angle of the transmission gear per rotation angle of the rotary gear is decreased, and in the case where the value indicated by the pointer tends to be larger than the true value, the rotation angle of the transmission gear per rotation angle of the rotary gear is increased. Hence, the linearity in indication of the pointer is improved as much, and the measurement value is indicated with high accuracy.

What is claimed is:

1. A cross coil type indicating instrument comprising:
   a coil bobbin having first and second chambers separately formed therein and communicating with each other through a communication space, and having a rectangular shaped coil winding portion in which said first chamber is formed, exterior surfaces of said winding portion being planar without any protrusions thereon;
   two coils wound around said planar exterior surfaces of the coil winding portion of said coil bobbin in such a manner that the coils are perpendicular to each other;
   a rotary shaft rotatably arranged with both ends thereof supported by top and bottom portions of the first chamber in said coil bobbin;
   a magnet rotor, fixedly secured to said rotary shaft, which is rotated according to a composite magnetic field due to magnetic fields formed by said two coils;
   a rotary gear, provided in said first chamber and being fixedly secured to said rotary shaft, which is rotated with said magnet rotor;
   a transmission gear provided in the second chamber of said coil bobbin so as to engage with said rotary gear in said communication space;
   an eccentric shaft, to which said transmission gear is fixedly secured, having an end portion produced out of said coil bobbin; and
   a pointer fixedly secured to the end portion of said eccentric shaft, wherein the lack of protrusions on said exterior surfaces allows for a maximum number of windings of said coil around said planar exterior surfaces.

2. The cross coil type indicating instrument according to claim 1, wherein said coil bobbin consists of an upper bobbin and a lower bobbin.

3. The cross coil type indicating instrument according to claim 2, wherein the first and second chamber of said coil bobbin are separated by a partition wall extended upwardly from a bottom surface of the lower bobbin except for said communication space through which said rotary gear and said transmission gear are engaged with each other.

4. The cross coil type indicating instrument according to claim 1, wherein a space under said magnet rotor is filled with silicon high in viscosity in the first chamber of said coil bobbin, and wherein during operation of said indicating instrument said space is disposed below an opening portion of said coil bobbin through which said end portion of said eccentric shaft protrudes such that said silicon does not leak through said opening portion.

5. The cross coil type indicating instrument according to claim 4, wherein the second chamber of said coil bobbin is filled with said silicon.

6. The cross coil type indicating instrument according to claim 1, wherein said rotary gear and transmission gear are elliptical gears such that, in the case where a value indicated by said pointer tends to be smaller than a true value, a rotation angle of said transmission gear per rotation angle of said rotary gear is decreased, and in the case where the value indicated by said pointer tends to be larger than the true value, the rotation angle of said transmission gear per rotation angle of said rotary gear is increased.

7. A cross coil type indicating instrument comprising:
   a coil bobbin having first and second chambers separately formed therein and having a coil winding portion where said first chamber is formed;
   two coils wound on the coil winding portion of said coil bobbin in such a manner that the coils are perpendicular to each other;
   a rotary shaft rotatably arranged with both ends thereof supported by top and bottom portions of the first chamber in said coil bobbin;
   a magnet rotor, fixedly secured to said rotary shaft, which is rotated according to a composite magnetic field due to magnetic fields formed by said two coils;
   a rotary gear, fixedly secured to said rotary shaft, which is rotated with said magnet rotor;
   a transmission gear provided in the second chamber of said coil bobbin so as to engage with said rotary gear;
   an eccentric shaft, to which said transmission gear is fixedly secured, having an end portion produced out of said coil bobbin; and
   a pointer fixedly secured to the end portion of said eccentric shaft, wherein said rotary gear and transmission gear are modified in such a manner that, in the case where a value indicated by said pointer tends to be smaller than a true value, a rotation angle of said transmission gear per rotation angle of said rotary gear is decreased, and in the case where the value indicated by said pointer tends to be larger than the true value, the rotation angle of said transmission gear per rotation angle of said rotary gear is increased and wherein said rotary gear and transmission gear are elliptical gears with which a distance between said rotary shaft and eccentric shaft can be maintained constant.

* * * * *